US008043987B2

(12) United States Patent
Chen et al.

(10) Patent No.: US 8,043,987 B2
(45) Date of Patent: Oct. 25, 2011

(54) LEAD-FREE FERROELECTRIC/ELECTROSTRICTIVE CERAMIC MATERIAL

(75) Inventors: Ang Chen, Hudson, OH (US); Yu Zhi, Hudson, OH (US)

(73) Assignee: The University of Akron, Akron, OH (US)

(*) Notice: Subject to any disclaimer, the term of this patent is extended or adjusted under 35 U.S.C. 154(b) by 522 days.

(21) Appl. No.: 11/719,411

(22) PCT Filed: Nov. 18, 2005

(86) PCT No.: PCT/US2005/041902
§ 371 (c)(1),
(2), (4) Date: May 20, 2009

(87) PCT Pub. No.: WO2006/060191
PCT Pub. Date: Jun. 8, 2006

(65) Prior Publication Data
US 2010/0009841 A1      Jan. 14, 2010

Related U.S. Application Data

(60) Provisional application No. 60/629,872, filed on Nov. 19, 2004.

(51) Int. Cl.
C04B 35/00 (2006.01)
C04B 35/495 (2006.01)
H01L 41/18 (2006.01)
H01L 41/187 (2006.01)
C01G 23/00 (2006.01)
C01F 11/02 (2006.01)

(52) U.S. Cl. ............ 501/136; 252/62.9 R; 252/62.9 PZ; 423/594.16; 423/598

(58) Field of Classification Search .................. 501/136; 252/62.9 R, 62.9 PZ; 423/598, 594.16
See application file for complete search history.

(56) References Cited

U.S. PATENT DOCUMENTS

| | | | |
|---|---|---|---|
| 5,637,542 A | 6/1997 | Takenaka | |
| 6,004,474 A | 12/1999 | Takenaka et al. | |
| 6,258,291 B1 | 7/2001 | Kimura et al. | |
| 6,514,427 B2 | 2/2003 | Nishida et al. | |
| 6,531,070 B1 | 3/2003 | Yamaguchi et al. | |
| 6,793,843 B2 * | 9/2004 | Furukawa et al. | 252/62.9 R |
| 7,090,785 B2 | 8/2006 | Chiang et al. | |
| 7,319,081 B2 | 1/2008 | Sakashita et al. | |
| 2002/0014196 A1 | 2/2002 | Takase et al. | |

(Continued)

FOREIGN PATENT DOCUMENTS
EP          1231192 A1     8/2002
(Continued)

OTHER PUBLICATIONS

Gomah-Pettry, Jean-Richard et al., Sodium-bismuth titanate based lead-free ferroelectric materials, 2004, Journal of the European Ceramic Society, 24, pp. 1165-1169.*

(Continued)

*Primary Examiner* — Melvin Mayes
*Assistant Examiner* — Kevin Johnson
(74) *Attorney, Agent, or Firm* — Renner, Kenner, Greive, Bobak, Taylor & Weber

(57) ABSTRACT

A ceramic composition comprising a binary system solid solution represented by the formulae: $(1-x)(Sr_{1-y}Bi_y)TiO_3+x(Na_{0.5}Bi_{0.5})TiO_3$ and
$(1-x)(Sr_{1-1.5y}Bi_y)TiO_3+x(Na_{0.5}Bi_{0.5})TiO_3$, wherein $0<x<1$ and $0<y\leq 0.2$.

13 Claims, 4 Drawing Sheets

U.S. PATENT DOCUMENTS

| | | |
|---|---|---|
| 2002/0036282 A1 | 3/2002 | Chiang et al. |
| 2003/0001131 A1 | 1/2003 | Takase et al. |
| 2004/0127344 A1 | 7/2004 | Sato et al. |

FOREIGN PATENT DOCUMENTS

| | | |
|---|---|---|
| EP | 1253122 A1 | 10/2002 |

OTHER PUBLICATIONS

Gomah-Pettry, J. R. et al., Ferroelectric relaxor behavior of Na0.5Bi0.5TiO3-SrTiO3 ceramics, 2004, Phys. Stat. Sol. (b), 8, pp. 1949-1956.*

Jaffe, B. et al, Piezoelectric Ceramics, Academic Press, London, 1971.

Haertling, G.H., Ferroelectric Ceramics: History and Technology, J. Am. Ceram. Soc. 82, 1999, pp. 797-818.

Park, S.E. et al, Ultrahigh Strain and Piezoelectric Behavior in Relaxor Based Ferroelectric Single Crystals, J. Appl. Phys. 82, 1997, pp. 1804-1811.

Bellaiche, L et al, Intrinsic Piezoelectric Response in Perovskite Alloys: PMN-PT versus PZT, Phys. Rev. Lett. 83, 1999, pp. 1347-1350.

Cox, D.E. et al, Universal Phase Diagram for High-Piezoelectric Perovskite Systems, Appl. Phys. Lett. 79, 2001, pp. 400-402.

Sabolsky, E.M. et al, Dielectric and Piezoelectric Properties of <001> Fiber-Textured 0.675Pb . . . , J. Appl. Phys. 93, 2003, pp. 4072-4080.

Lee, H.N. et al, Ferroelectric Bi3.25LaO.75Ti3O12 Films of Uniform a-Axis Orientation on Silicon Substrates, Science, 296, 2002, pp. 2006-2009.

Park, B.H. et al, Lanthanum-sbustitued Bismuth Titanate for Use in Non-volatile Memories, Nature 401, 1999, pp. 682-684.

Tu, C.-S. et al, Sequence of Dielectric Anomalies and High-temperature Relaxation Behavior in . . . , Phys. Rev. B 49, 1994, pp. 11550-11559.

Takenaka, T., Piezoelectric Properties of Some Lead-free Ferroelectric Ceramics, Ferroeelctrics, 230, 1999, pp. 87-98.

Nagata, H. et al, Effects of Substitution on Electrical Properties of . . . , Proc. of 12th IEEE Int. Symp. on Applications of Ferroelectrics. Jul. 30-Aug. 2, 2000 pp. 45-51, Hawaii.

Kuharuangrong, S. et al, Compositional Modifications of 10%Pb-doped . . . , J. Am. Ceram. Soc. 78, 1995, pp. 2274-2778.

Lee, J.K. et al, Phase Transitions and Dielectric Properties in A-site ion substitued . . . , J. Appl. Phys., 91, 2002, pp. 4538-4542.

Zhang, M.S. et al, Raman-spectroscopy of Na0.5Bi0.5TiO3, Ferroelectrics Lett., 6, 1986, pp. 147-152.

Sheets, S.A. et al, Relaxor Single Crystals in the (Bi1/2Na1/2)(1-x) . . . , J. Appl. Phys. 90, 2001, pp. 5287-5295.

A-Paz De Araujo, C. et al, Fatigue-free Ferroelectric Capacitors with Platinum-electrodes, Nature 374, 1995, pp. 627-629.

Park, S.E. et al, Crystallographically Engineered BaTiO3 Single Crystals for High-performance Piezoelectrics, J. Appl. Phys. 86, 1999, pp. 2746-2750.

Fu, F.X. et al, Polarization Rotation Mechanism for Ultrahigh Electromechanical Response in Single-crystal Piezoelectrics, Nature 403, 2000, pp. 281-283.

Uchino, K. et al, Electrostrictive Effect in Lead Magnesium Niobate Single Crystal, J. Appl. Phys. 51, 1980, pp. 1142-1145.

Park, S.E. et al, Electric Field Induced Anisotropy in Electrostrictive . . . , Ferroelectrics 207, 1998, pp. 519-526.

Haeni, J.H. et al, Room-Temperature Ferroelectricty in Strained SrTiO3, Nature 430, 2004, pp. 758-761.

Venturini, E.L. et al, Pressure as a Probe of the Physics of . . . , Phys. Rev. B, 69, 2004, pp. 184105-1-184105-9.

Chen, A. et al, Dielectric Relaxor and Ferroelectric Relaxor: Bi-doped Paraelectric SrTiO3, J. Appl. Phys. 91, 2002, pp. 1487-1494.

Chen, A. et al, Dielectric Relaxation Modes in Bismuth-doped SrTiO3: The Relaxor Behavior, Phys. Rev. B, 59, 1999, pp. 6670-6674.

Chen, A. et al, DC Electric-field Dependence of the Dielectric Constant in Polar Dielectrics: Multipolarization Mechanism Model, Phys. Rev. B 69, 2004, pp. 174109-1-174109-8.

Moreo, A. et al, Phase Separation Scenario for Manganese Oxides and Related Materials, Science 283, 1999, pp. 2034-2040.

Comes, R. et al, Linear Disorder in the Crystals (case of silicon, quartz, and ferroelectric Perovskite), Acta Cryst. A26, 1970, pp. 244-254.

Burfoot, J.C. et al, Polar Dielectrics and their Applications, University of California Press, California, 1979.

Jona, F. et al, Ferroelectric Crystals, Dove Publications Inc., New York, 1993.

Kuwata, J. et al, Dielectric and Ferroeelctric Properties of 0.91 Pb . . . , Jpn. J. Phys. Part 1, 21, 1982, pp. 1298-1302.

Liu, S.F. et al, Electric Field Dependence of Piezoelectric Properties for Rhombohedral . . . , J. Appl. Phys. 85, 1999, pp. 2810-2814.

Business Communications Co., Inc. RGB-244 Piezoelectric Ceramics: Markets and Materials.

Wada, S. et al, Enhanced Piezoelectric Property of Barium Titanate Single Crystals with Engineered Domain Configurations, Jpn. J. Appl. Phys 38, 1999, pp. 5505-5511.

Rherig, P.W. et al, Piezoelectric Properties of Zirconium-doped Barium Titanate Single Crystals Grown by . . . , J. Appl. Phys. 86, 1999, pp. 1657-1661.

Yu, Z. et al, Orientation Dependence of the Ferroelectric and Piezoelectric Behavior of Ba . . . , Appl.Phys Lett. 77, 2000, pp. 1535-1537.

Chen, A. et al, Piezoelectric and Electrostrictive Strain Behavior of Ce-doped BaTiO3 Ceramics, App. Phys. Lett 80, No. 18, 2002, pp. 3424-3426.

Yu, Z. et al, Piezoelectric and Strain Properties of Ba . . . , J. Appl. Phys. 92, 2002, pp. 1489-1493.

Chen, A. et al, Synthesis and Characterization of Ba(Ti,Ce)O3 Ceramics, Journal of the European Ceramic Society 17, 1997, pp. 1217-1221.

Siny, I.G. et al, Critical Acoustic Behavior of the Relaxor Ferroelectric . . . , Phys. Rev. B 51, 1995, pp. 5659-5665.

Takenaka, T. et al, Dielectric Piezoelectric and Pyroelectrci Properties of . . . , Ferroelectrics 95, 1989, pp. 153-156.

Zvigzds, J.A. et al, X-ray Study of Phase Transitions in Ferroelectric . . . , Ferroelectrics 40, 1982, pp. 75-77.

Vakhrushev, S.B. et al, Phase Transitions and Soft Modes in Sodium Bismuth Titanate, Ferroelectrics 63, 1985, pp. 153-160.

Suchanicz, J. et al, Electrostrictive Strain and Pyroeffect in the Region of Phase Coexistance in . . . , Ferroelectrics 77, 1988, pp. 107-110.

Suchanicz, J. et al, On the Phase Transition in Na0.5Bi0.5TiO3, Ferroelectrics Letters 12, 1990, pp. 71-78.

Kuharuangrong, S. et al, Characterization of (Na0.5Bi0.5)TiO3-PbTiO3 dielectric Materials, J. Am. Ceram. Soc. 79, 1996, pp. 1273-1280.

Park, S.E. et al, Phase Relations in the system of . . . , J. Appl. Phys. 79, 1996, pp. 383-387.

Hong, K.S. et al, Phase Relation in the system of . . . , J. Appl. Phys. 79, 1996, pp. 388-392.

Hosono, Y. et al, Crystal Growth and Electrical Properties of Lead-free Piezoelectric Material . . . , Jpn J Appl. Phys. Part 1, 40, 2001, pp. 5722-5726.

Kaewkamnerd, N. et al, Material Characterization of . . . , Sensor Mater 9, 1997, pp. 47-55.

Chiang, Y.-M. et al, Lead-free High-strain Single-crystal Piezoelectrics in the Alkaline-bismuth-titanate . . . , Appl. Phys. Lett. 73, 1998, pp. 3683-3685.

Chen, A. et al, Oxygen-vacancy-related Low-frequency Dielectric Relaxation and Electrical . . . , Phys. Rev. B 62, 2000, pp. 228-236.

Chen, A. et al, Phono-coupled Impurity Dielectrci modes in . . . , Phys. Rev. B 61, 2000, pp. 11363-11366.

Chen, A. et al, Impurity-induced Ferroelectric Relaxor Behavior in Quantum Paraelectric . . . , Phys. Rev. B 61, 2000, pp. 957-961.

Chen, A. et al, Dielectric and Ultrasonic Anomalies at 16, 37, and 65 K in SrTiO3, Phys. Rev. B 59, 1999, pp. 6661-6664.

Chen, A. et al, Dielectric Anomalies in Bismuth-dpped SrTiO3: Defect modes at Low Impurity Concentrations, Phys. Rev. B 59, 1999, pp. 6665-6669.

Saito, Y. et al, Lead-Free Piezoceramics, Nature Publishing Group, 1-3, 2004.

Cho, S.Y. et al, The Variation of Phase Transition Behavior on Substituting Pb . . . , Ferroelectrics 1996, 195, pp. 27-30.

Chu, B.J. et al, Piezoelectric property and relaxation phase transition of (Bi 1/2 NA 1/2) . . . , J. Inorg. Mater 2000, 15 (5) pp. 815-821.

* cited by examiner

LEAD-FREE FERROELECTRIC/ELECTROSTRICTIVE CERAMIC MATERIAL

BACKGROUND OF THE INVENTION

The present invention is directed to ferroelectric and electrostrictive ceramic materials, especially those being lead-free and showing very strong remnant polarization and massive pure electrostriction, especially in $(Sr,Bi,Na)TiO_3$ solid solutions. The composition of the present invention is further directed to a solid state solution of bismuth-sodium titanate and bismuth-strontium titanate.

Ferroelectric materials show that the permanent electric dipole moment of materials can be reoriented by the application of an external electric field. The piezoelectric effect can be described in a simple way: electricity is generated when mechanical pressure is applied. Inversely, by applying an electric field to a piezoelement, a mechanical deformations result. This is referred to as the inverse piezoelectric effect. The inverse piezoelectric effect has sometimes been confused with the electrostrictive effect which occurs in solid dielectrics. The two effects differ in two important respects. The piezoelectric strain is proportional to the electric-field intensity and changes sign with it, whereas the electrostrictive strain is proportional to the square of the field intensity and therefore independent of its direction. Further, the piezoelectric strain is usually larger by several orders of magnitude than the electrostrictive strain, and the electrostrictive effect occurs simultaneously with the piezoelectric effect but may be ignored for practical purposes in many cases.

In some materials, the electrostrictive effect is significant and can be used for practical applications. For example, $Pb(Mn_{1/3}Nb_{2/3})O_3$ (PMN) and its solid solutions $Pb(Mn_{1/3}Nb_{2/3})O_3$—$PbTiO_3$ (PMN-PT) exhibit a high electrostrictive strain level of ~0.1% at 70 kV/cm, with the electrostrictive coefficient $Q_{11}$=~0.02 m$^4$C$^{-2}$. PMN, often, is referred to as an "Electrostrictive Ceramic". Compared with the piezoelectric effect, the electrostrictive effect has several unique advantages, such as less or no hysteretic loss up to high frequencies, being temperature-stable, and exhibiting a fast response time.

Currently, thousand tons of lead-containing ferroelectric/electrostrictive materials, such as $PbZrO_3$—$PbTiO_3$ (PZT), $Pb(Mg_{1/3}Nb_{2/3})O_3$—$PbTiO_3$ (PMN-PT), and $Pb(Zn_{1/3}Nb_{2/3})O_3$—$PbTiO_3$ (PZN-PT), are produced every year for a large range of applications. Due to the toxicity of lead, alternative lead-free materials are highly desirable for environmental reasons. New environmental legislation enacted by the European Union (EU) will take effect on Jul. 1, 2006 (Directive 2002/95/EC of the European Parliament and of the council of 27 Jan. 2003 on the restriction of the use of certain hazardous substances in electrical and electronic equipment). The Restrictions on Hazardous Substances directive limits the use of lead, cadmium, mercury, hexavalent chromium and two brominated fire retardants. It is expected that USA and Japan will also have similar restrictions in near future. Therefore, substitutes for the toxic lead containing materials are highly desirable for electronic industry.

In the last two decades, great effort has been made to search for high performance lead-free materials. For instance, $(Bi_{0.5}Na_{0.5})TiO_3$-based, $Bi_4Ti_3O_{12}$-based, $SrBi_2Ta_2O_9$-based, and $BaTiO_3$-based systems have been extensively studied. However, the remnant polarization and electrostrictive properties of these lead-free materials are still far below those of the currently used lead-containing materials. Some examples are listed are barium titanate $BaTiO_3$ materials and bismuth sodium titanate $(Bi_{0.5}Na_{0.5})TiO_3$ materials Bismuth sodium titanate $(Bi_{1/2}Na_{1/2})TiO_3$ (BNT) is more similar to PZT, with a $T_c$ at ~230° C., and room temperature dielectric constant ($\in$=2500~6000). Some modified BNT ceramics manifest reasonable ferroelectric/piezoelectric properties, which make the material promising as a substitute for PZT. Since the late 1980s, efforts have been made to study the possibility of substitution of lead-free BNT for PZT. Simple perovskite compounds, like $BaTiO_3$, $PbTiO_3$, $SrTiO_3$, etc., were used to modify the ferroelectric/piezoelectric properties of BNT. Nagata and Takenaka ("Effect of substitution on electrical properties of $(Bi_{1/2}Na_{1/2})TiO_3$-based lead-free ferroelectrics"; Proc. of 12th IEEE Int. Symp. on Applications of Ferroelectrics (ed. Streiffer, S. K., Gibbons, B. J. and Trurumi, T.); vol. I, pp 45-51; Jul. 30-Aug. 2, 2000; Honolulu, Hi., USA.), for example, obtained the highest remnant polarization $P_r$ value of 33.7 μC/cm$^2$ reported for $(Bi_{0.5}Na_{0.5})TiO_3$ systems, which appears to be one of the best result to date published in the literature for BNT-based materials.

Very high strain (up to ~1%) has been observed in a series of ferroelectric/piezoelectric/electrostrictive materials (single crystals and ceramics), such as, tetragonal $BaTiO_3$ single crystals, and $(Bi_{1/2}Na_{1/2})TiO_3$-based materials. However, the strain versus electric field profile exhibits large hysteresis at a reasonable frequency (for example, at 1 Hz) due to the piezoelectric effect. The material does not exhibits a pure electrostrictive effect. This becomes a critical disadvantage when the displacement of actuators needs to be precisely controlled.

A number of patents and patent applications have disclosed attempts at establishing a non-lead dielectric ceramic composition. For example, U.S. Pat. No. 5,637,542 to Takenaka teaches a binary system, solid solution represented as (1-x) BNT-xNN, wherein BNT is $(Bi_{1/2}Na_{1/2})TiO_3$ and NN is $NaNbO_3$ as constitute to the solid solution. U.S. Pat. No. 6,004,474 to Takenaka et al. teaches a lead-free piezoelectric material represented by the formula $x[Bi_{1/2}NA_1]TiO_3$-y$[MeNbO_3]$-(z/2)$[Bi_2O_3.Sc_2O_3]$, where Me is K or Na. Other lead-free piezoelectric ceramic compositions using BNT are taught in U.S. Pat. No. 6,514,427 to Nishida et al.; U.S. Pat. No. 6,531,070 to Yamaguchi et al.; U.S. Pat. No. 6,258,291 to Kimura et al.; US Patent Application 2004/0127344 to Sato et al.; and US Patent Application 2003/0001131 to Takase et al. Chiang et al in US Patent Application No. 2002/0036282 teaches a perovskite compound which functions as an electromechanically active material and may possess electrostrictive or piezoelectric characteristics. The compound is an alkali bismuth perovskite composition in which lead can be a part.

SUMMARY OF THE INVENTION

The present invention is the result of the discovery that lead-free materials can be produced that exhibit unexpected high ferroelectric and electrostrictive performance, as well as reasonable piezoelectric properties. The composition can be varied in its proportions to achieve different properties and functionalities, such as a very strong remnant polarization or massive pure electrostrictive strain with very high electrostrictive coefficient. This is achieved by modifying the polarization and strain behavior of solid solutions "(1-x)$(Sr_{1-1.5y}Bi_y)TiO_3$+x$(Na_{0.5}Bi_{0.5})TiO_3$" and "(1-x) $(Sr_{1-y}Bi_y)TiO_3$+x$(Na_{0.5}Bi_{0.5})TiO_3$" where 0<x<1 and 0<y≦0.2, and optionally with substituting K and/or Li at Na sites and/or Sn, Hf, Nb, and/or Ta at Ti sites; and/or using $MnO_2$, and/or CuO as dopants.

DETAILED DESCRIPTION OF THE INVENTION

The present invention is a composition consisting of "a ferroelectric relaxor"+"a ferroelectric" and results in a high performance lead-free ferroelectric solid solutions. A lead-free ferroelectric relaxor material $(Sr,Bi)TiO_3$ can be employed in combination with $(Na_{0.5}Bi_{0.5})TiO_3$.

The compositions are represented by the formulae "$(1-x)(Sr_{1-1.5y}Bi_y)TiO_3+x(Na_{0.5}Bi_{0.5})TiO_3$" where Sr vacancies (i.e., 0.5y Sr vacancies) in $(Sr_{1-1.5y}Bi_y)TiO_3$ maintains the charge balance, or "$(1-x)(Sr_{1-y}Bi_y)TiO_3+x(Na_{0.5}Bi_{0.5})TiO_3$", where 0<x<1 and 0<y≦0.2. The compositions can be employed with or without substituting K and/or Li at Na sites and/or Sn, Hf, Nb, and/or Ta at Ti sites; and/or the use of $MnO_2$, and/or CuO as dopants.

The solid solutions are prepared by a solid state reaction method as is known in the art. The raw materials, $SrCO_3$, $TiO_2$, $Bi_2O_3$, $Na_2CO_3$, are weighted according to compositions, and are ball-milled to reduce and blend the powders. The mixed powder was dried and calcined in air to 800-900° C. for 2-4 hours. Then the powder was ball-milled again, and dried, and pressed into disks or rods, sintered in air at 1200-1300° C. for 2-4 hours. Silver or gold electrodes were made and attached on two sides of the discs or rods. For piezoelectric measurement, a poling process is needed, which was done at 80-120° C. for 15 minutes under a dc bias 50-100 kV/cm.

Hysteresis loops and strain measurements were performed at room temperature using a modified Sawyer-Tower circuit, and a linear variable displacement transducer (LVDT) driven by a lock-in amplifier at 1 Hz, respectively. X-ray diffraction analysis shows that all compositions are single phase. Quasi-static piezoelectric constant was measured by using a $d_{33}$ meter. Dielectric constant measurements were performed on an HP 4284A LCR meter.

EXAMPLE 1

High Ferroelectric Remnant Polarization Solid Solutions

Figure 1:
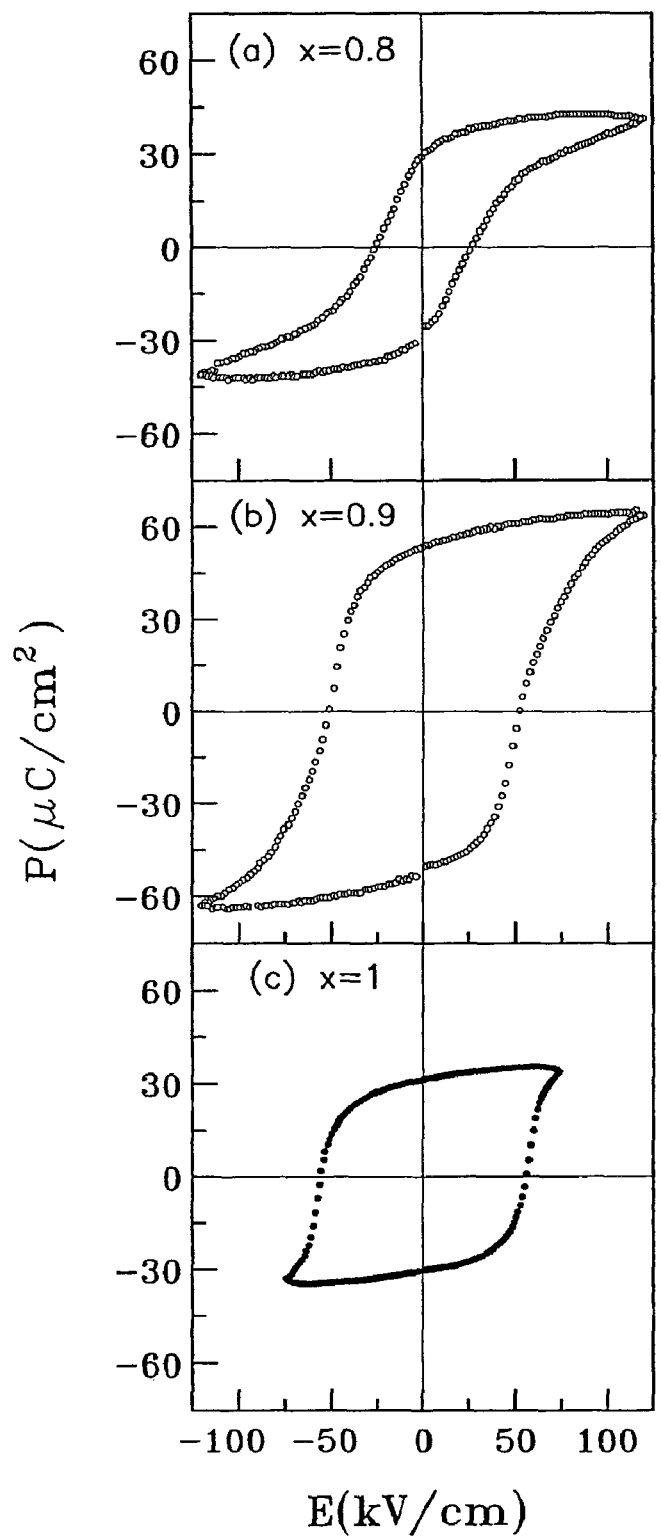
FIG. 1 Polarization (P) versus electric field (E) at 1 Hz for the samples "$(1-x)(Sr_{1-1.5y}Bi_y)TiO_3+x(Na_{0.5}Bi_{0.5})TiO_3$" with y=0.2 and x=0.8, 0.9 and 1.

In materials with compositions of "$(1-x)(Sr_{1-1.5y}Bi_y)TiO_3+x(Na_{0.5}Bi_{0.5})TiO_3$", when y=0.2, and 0.65≦x≦0.95, the materials shows good ferroelectric performance. Ferroelectric hysteresis loops (polarization P versus electric field E) were measured at room temperature. The P~E loops at 1 Hz are plotted for x=0.8, and 0.9, in FIG. 1, the sample with x=1 is also plotted as a comparison. For x=0.8, $P_r$ is ~24 µC/cm². Then, for x=0.9, a very high remnant polarization of ~51 µC/m² is obtained with a coercive field ~50 kV/cm. However, with further increasing x, $P_r$ decreases. For x=1, $P_r$ is ~30 µC/cm².

The piezoelectric constant $d_{33}$ is of 80-120 pC/N for the samples with x=0.65-0.9 measured by quasi-static method.

EXAMPLE 2

High Electrostrictive Solid Solutions

Figure 2:
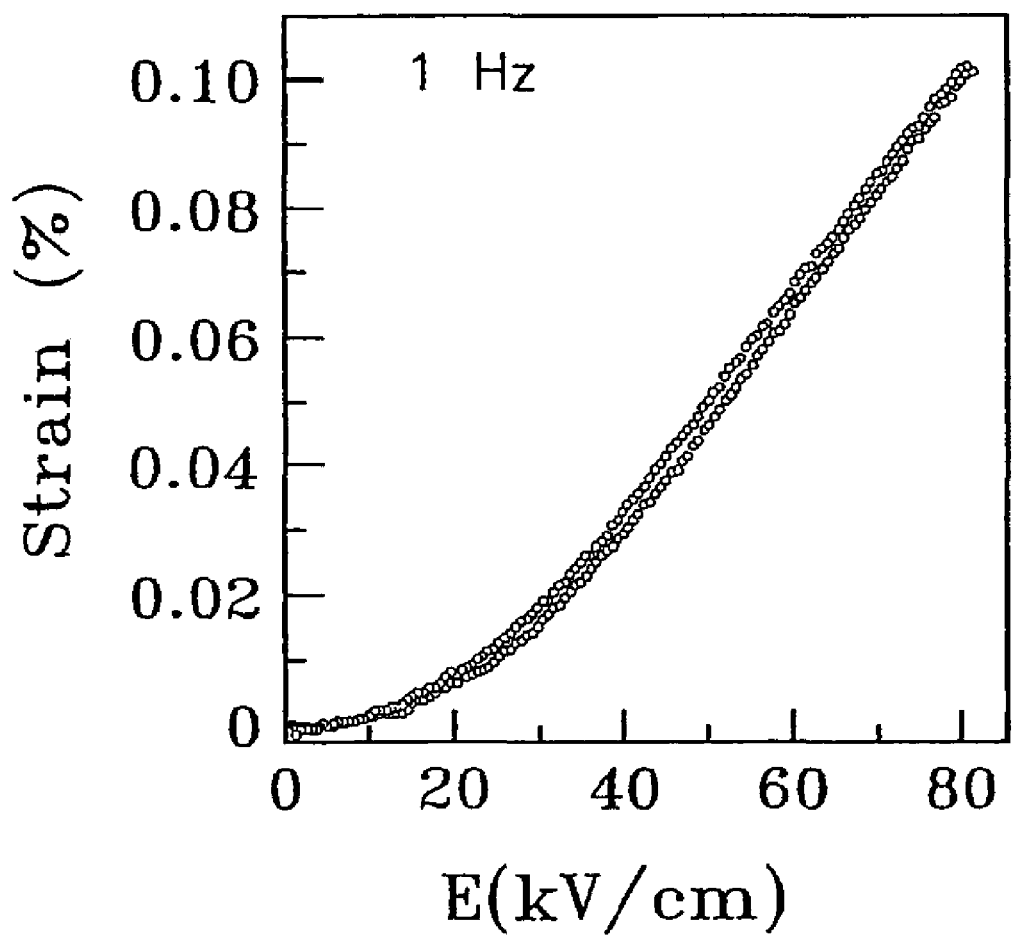
FIG. 2 Uni-polar strain (S) versus electric field (E) at 1 Hz for the sample "$(1-x)(Sr_{1-1.5y}Bi_y)TiO_3+x(Na_{0.5}Bi_{0.5})TiO_3$" with y=0.2 and x=0.5

In materials with compositions of "$(1-x)(Sr_{1-1.5y}Bi_y)TiO_3+x(Na_{0.5}Bi_{0.5})TiO_3$", when y=0.2 and x=0.5, the materials shows excellent electrostrictive performance. Electric field driven strains (S) were measured at room temperature and 1 Hz. The strain level reaches ~0.1% at ~80 kV/cm for x=0.5, as shown in FIG. 2. It is noted that for the x=0.5 sample with a strain level of 0.1%, the profile of the strain versus electric field is hysteresis-free.

Figure 3:
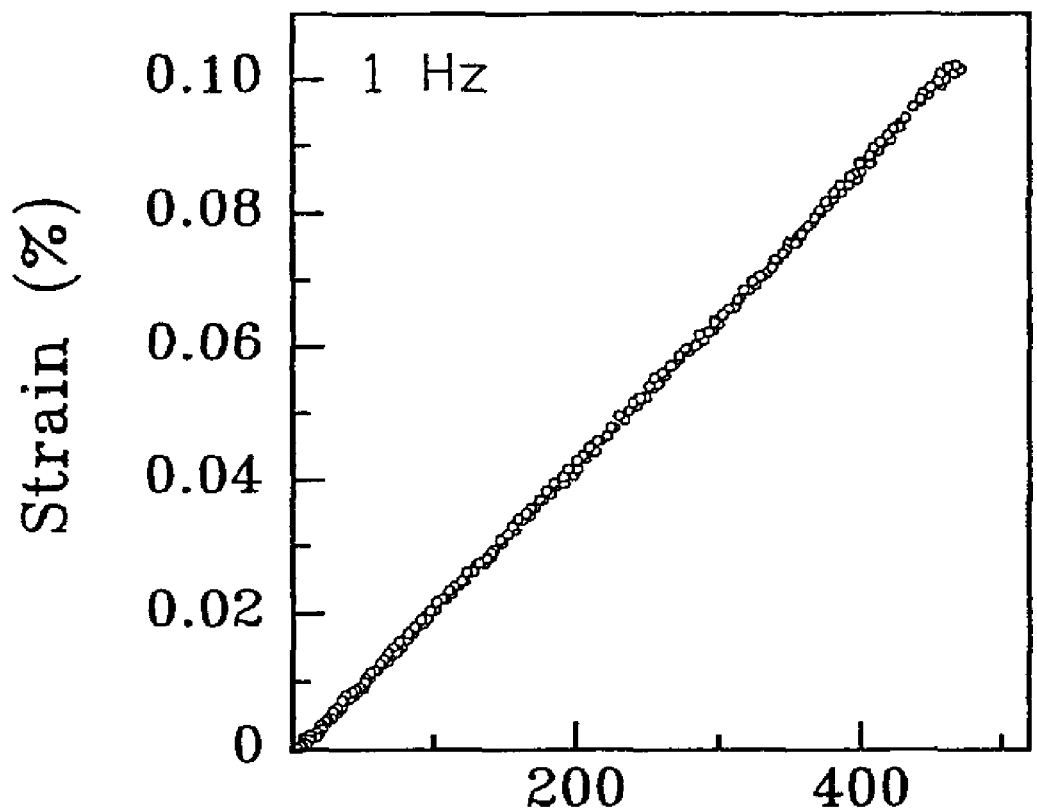
FIG. 3 Strain versus $P^2$ for the sample "$(1-x)(Sr_{1-1.5y}Bi_y)TiO_3+x(Na_{0.5}Bi_{0.5})TiO_3$" with y=0.2 and x=0.5

It is known that strain originating from the electrostrictive effect follows the theoretically derived quadratic relation:

$$S=QP^2$$

where Q is the electrostrictive coefficient. The strain S versus $P^2$ plot for the sample with x=0.5 is shown in FIG. 3. It can be seen that the S~$P^2$ profile fits very well to a straight line in the entire electric-field range. This indicates that a purely electrostrictive effect with a hysteresis-free high strain level is observed. From the fit to the experimental data in FIG. 3, Q=0.02 $m^4C^{-2}$ is obtained, which is as high as the Q value of PMN-PT.

It should be noted that the strain behavior of the so-called electrostrictive material, PMN-PT, deviates from a linear S vs. $P^2$ relationship. This indicates that PMN-PT does not exhibit purely electrostrictive behavior, and some extra contributions, including the piezoelectric effect, occur in addition to the electrostrictive effect. The present S vs. $P^2$ profile in FIG. 3, however, exhibits a good linear relationship, indicating a "purely" electrostrictive effect with a high strain level of 0.1%. This behavior has great potential for applications such as strain/displacement actuators, which require precise motion.

Figure 4:
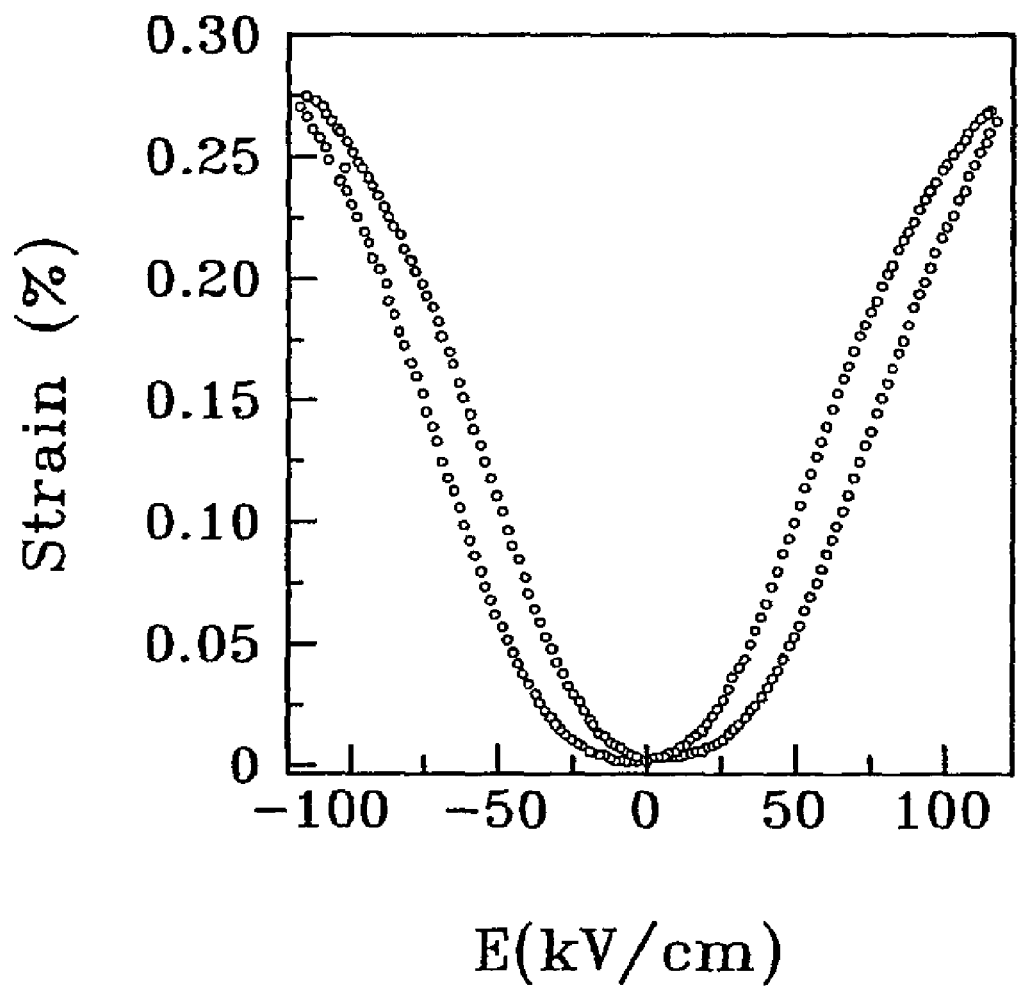
FIG. 4 Bipolar strain (S) versus electric field (E) at 1 Hz for the sample "$(1-x)(Sr_{1-1.5y}Bi_y)TiO_3+x(Na_{0.5}Bi_{0.5})TiO_3$" with y=0.2 and x=0.65

At a higher Bi and Na concentration, e.g. x=0.65, the sample exhibits a strain level of 0.28% (FIG. 4), but a slight hysteresis loop is observed.

The results indicate that a series of excellent ferroelectric and electrostrictive properties are obtained, ranging from a very strong remnant polarization to a high purely electrostrictive effect in the solid solution system. In particular, a remnant polarization as high as ~51 µC/cm² (with a coercive field ~50 kV/cm) and a "purely" electrostrictive strain level ~0.1% at 80 kV/cm with a electrostrictive coefficient of Q=0.02 $m^4C^{-2}$; which are comparable with, or even higher than that of the lead-containing ferroelectric ceramics, such as PZT, PMN-PT and PZN-PT. This strongly suggests that the system is a very promising for lead-free ferroelectric and electrostrictive applications. The piezoelectric constant $d_{33}$ is of 80-120 pC/N measured by quasi-static method.

As can be seen, the ceramic composition of the present invention can be employed as a ferroelectric device, an electrostrictive device, or a piezoelectric device. Specific applications would include ferroelectric random access memory, nonlinear optical device, electrostrictive actuator, positioning device for manufacturing, scanning probe microscope, surface acoustic wave device, and piezoelectric actuator, although the list is not exhaustive and would include other similar or like applications.

The foregoing embodiments of the present invention have been presented for the purposes of illustration and description. These descriptions and embodiments are not intended to be exhaustive or to limit the invention to the precise form

What we claim is:

1. A ceramic composition comprising a binary system solid solution represented by the formulae:

$$(1-x)(Sr_{1-y}Bi_y)TiO_3 + x(Na_{0.5}Bi_{0.5})TiO_3 \text{ or}$$

$$(1-x)(Sr_{1-1.5y}Bi_y)TiO_3 + x(Na_{0.5}Bi_{0.5})TiO_3,$$

wherein $0<x<1$ and $0<y\leq0.2$.

2. The ceramic composition of claim 1, wherein the formula is $(1-x)(Sr_{1-y}Bi_y)TiO_3 + x(Na_{0.5}Bi_{0.5})TiO_3$ and wherein $0<x<1$ and $0<y\leq0.2$.

3. The ceramic composition of claim 1, wherein the formula is $(1-x)(Sr_{1-1.5y}Bi_y)TiO_3 + x(Na_{0.5}Bi_{0.5})TiO_3$, and wherein $0<x<1$ and $0<y\leq0.2$.

4. The ceramic composition of claim 1, wherein the material is in the form of a polycrystalline material, single crystalline material, thin film, or textured crystalline material.

5. The ceramic composition of claim 1, wherein $0<y\leq0.2$, and $0.65\leq x\leq0.95$.

6. The ceramic composition of claim 5, wherein said ceramic material has a remnant polarization of ~51 μC/cm² with a coercive field ~50 kV/cm.

7. The ceramic composition of claim 1, wherein $0<y\leq0.2$, $0.05\leq x<0.65$, and said ceramic composition is an electrostrictive ceramic material.

8. The ceramic composition according to claim 7, wherein said ceramic composition has a strain level of ~0.1% at ~80 kV/cm and an electrostrictive coefficient $Q=0.02$ m⁴C⁻².

9. The ceramic composition according to claim 5, wherein said ceramic material has a $d_{33}$ level of 80-120 pC/N.

10. The ceramic composition of claim 1, wherein said ceramic composition has a dielectric constant above 2000 at room temperature.

11. The ceramic composition of claim 1, wherein the material is in the form of a rod, fiber, ribbon or sheet.

12. The ceramic composition of claim 1, wherein the ceramic composition optionally includes substituting K or Li at Na sites and/or Nb, Ta, Sn, and/or Hf at Ti sites; or using $MnO_2$, or CuO as dopants.

13. A ferroelectric device, an electrostrictive device, or a piezoelectric device made from the ceramic composition of claim 1, wherein the device is selected from the group consisting of ferroelectric random access memory, nonlinear optical device, electrostrictive actuator, positioning device for manufacturing, scanning probe microscope, surface acoustic wave device, and piezoelectric actuator.

* * * * *